(12) United States Patent
Yeap et al.

(10) Patent No.: US 6,617,214 B2
(45) Date of Patent: Sep. 9, 2003

(54) INTEGRATED CIRCUIT STRUCTURE AND METHOD THEREFORE

(75) Inventors: Choh-Fei Yeap, Austin, TX (US); Srinivas Jallepalli, Austin, TX (US); Alain C. Duvallet, Austin, TX (US); Franklin D. Nkansah, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/839,663

(22) Filed: Apr. 23, 2001

(65) Prior Publication Data
US 2002/0153559 A1 Oct. 24, 2002

(51) Int. Cl.[7] .............................................. H01L 21/336
(52) U.S. Cl. ...................... 438/283; 438/289; 438/290; 438/981
(58) Field of Search ................................ 438/981, 283, 438/289, 290, 301, 275, 278, 217

(56) References Cited

U.S. PATENT DOCUMENTS 5,618,740 A * 4/1997 Huang ........................ 438/224
6,124,616 A * 9/2000 Dennison et al. ............ 257/369
6,413,824 B1 * 7/2002 Chatterjee et al. .......... 438/275
2002/0052083 A1 * 5/2002 Zhang et al. ................ 438/275

* cited by examiner

Primary Examiner—Michael S. Lebentritt
Assistant Examiner—Beth E. Owens
(74) Attorney, Agent, or Firm—Kim-Marie Vo; James L. Clingan, Jr.

(57) ABSTRACT

An integrated circuit is made with transistors having varying characteristics in the same well. One transistor, which is particularly useful as an I/O device, has a relatively deep source/drain with a relatively thick gate dielectric. The well doping is selected so that this transistor has low leakage. Another transistor type, which is particularly useful for low voltage analog purposes, has a relatively thin gate dielectric and the relatively deep source/drain. A third transistor type, which is particularly suited for high density and low power operation, has a relatively shallow source/drain, the relatively thin gate dielectric, and a high dose halo implant. A fourth transistor type, which may also be present for high-speed operations, has the relatively thin gate dielectric, the relatively shallow source/drain, and may have a halo implant. The halo implant will be of a lower dosage than the halo implant for the third transistor type.

18 Claims, 3 Drawing Sheets

INTEGRATED CIRCUIT STRUCTURE AND METHOD THEREFORE

FIELD OF THE INVENTION

This invention relates, generally, to semiconductor processing and devices and, more specifically, to system on chip technology.

BACKGROUND OF THE INVENTION

Typically, when forming core devices and I/O devices on the same chip, the two devices are formed in separate wells in order to account for the devices' differences in threshold voltage ($V_T$). A core device uses a lower $V_T$ as compared to the I/O devices. The use of separate wells increases processing complexity by increasing the number or masks used during manufacturing of integrated circuits (ICs).

When an analog device is needed on the chip, a core device is used for this function because the power supply for the analog device is typically the same as that for the core device if low voltage operation is required. Typically, the core device will be modified to increase the gate length of the transistor to account for the stricter requirements of linearity, for example, of the analog device. Since core devices typically have halo implants, the output conductance of such a device is too great for an analog device. At a given gate voltage, the current will continue to increase with increasing drain voltage in the saturation regime due to the halo implants.

Therefore, a need to decrease the processing complexity of integrating core devices and I/O devices on the same chip is needed. In addition, an integration scheme with improved analog devices is also needed.

BRIEF DESCRIPTION OF THE DRAWINGS

The present invention is illustrated by way of example and is not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 5:
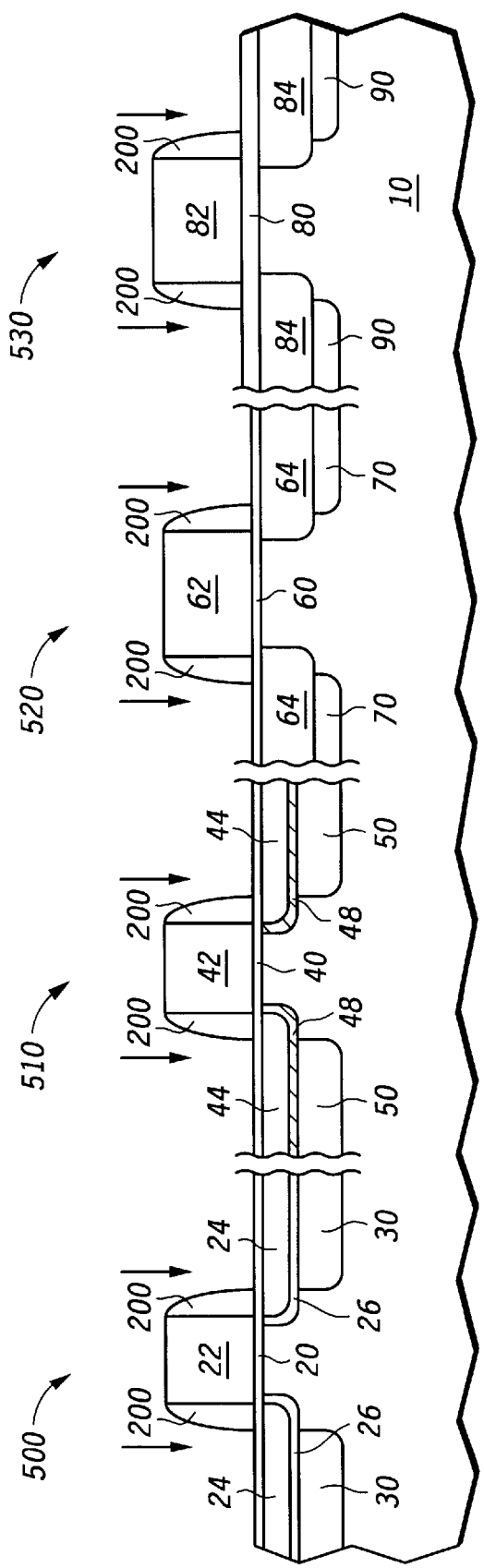
FIG. 5 illustrates a cross-section of a portion of a semiconductor substrate showing deep source and drain implants for all devices in accordance with the present invention.

In accordance with one embodiment of the present invention, an integrated circuit comprises core devices 500 and 510, analog device 520 and I/O device 530, as shown fully processed in FIG. 5. The devices are manufactured within the same semiconductor well 10, which is part of a semiconductor substrate. In a preferred embodiment, the semiconductor substrate is monocrystalline silicon. Other suitable materials, however, such as gallium arsenide, silicon-on-insulator (SOI), germanium, polycrystalline silicon and the like can be used. In one embodiment, the semiconductor well is doped to set the threshold for analog device 520 or I/O device 530 so that current leakage is less than approximately 10 picoamps per micron of transistor width. The semiconductor well is formed by ion implantation. The well is doped either n-type or p-type depending on the element(s) implanted. For example, implanting phosphorus or arsenic will result in an n-well and implanting boron will result in a p-well.

The specification will be described with reference to two core devices, one analog and one I/O, all on the same chip. However, it is not necessary to have all devices on one chip, especially the two core devices. For example, in accordance with the present invention, one die will have one core device, one analog device and one I/O device. Also in accordance with the invention a die can have the core device with the super halo implant and the I/O device. Any combination of the described devices is in accordance with the present invention.

Figure 1:
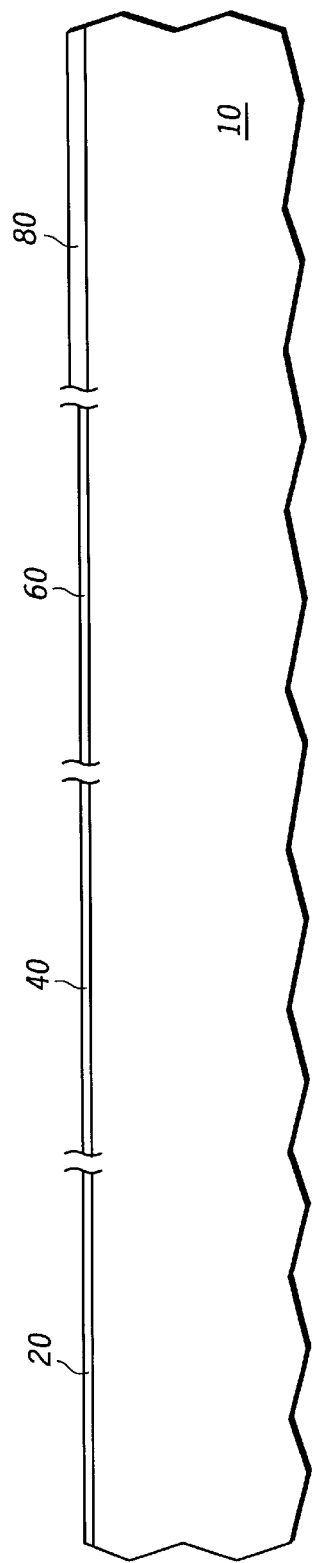
FIG. 1 is a cross-section of a portion of a semiconductor substrate after gate dielectrics are formed in accordance with the present invention.

Turning to FIG. 1, gate dielectrics 20, 40, 60 and 80 are grown using conventional methods. This includes thermal oxidation, thermal deposition and the like. Gate dielectrics 20, 40 and 60 are, generally, 15–35 Angstroms equivalent oxide thickness (EOT). Preferably, gate dielectrics 20, 40 and 60 are 20–25 Angstroms EOT. In one embodiment, gate dielectrics 20, 40 and 60 are approximately the same thickness. Gate dielectric 80, used to form the I/O device, is, generally, thicker than gate dielectrics 20, 40 and 60 and is approximately 35–100 Angstroms EOT. More specifically, gate dielectric 80 is 40–70 Angstroms EOT.

Following gate dielectric formation gate electrodes 22, 42, 62 and 82 are formed using conventional methods such as chemical vapor deposition (CVD), plasma vapor deposition (PVD), atomic layer deposition (ALD) combinations of the above, and the like. As one of ordinary skill in the art knows, photoresist patterning and etching (not shown) may be used to form the gate electrodes. Gate electrodes, or gates, 22, 42, 62 and 82 can be polysilicon or metals and can be formed simultaneously or during different processing sequences. In the latter case, additional photoresist patterning and etching is probably necessary.

Figure 2:
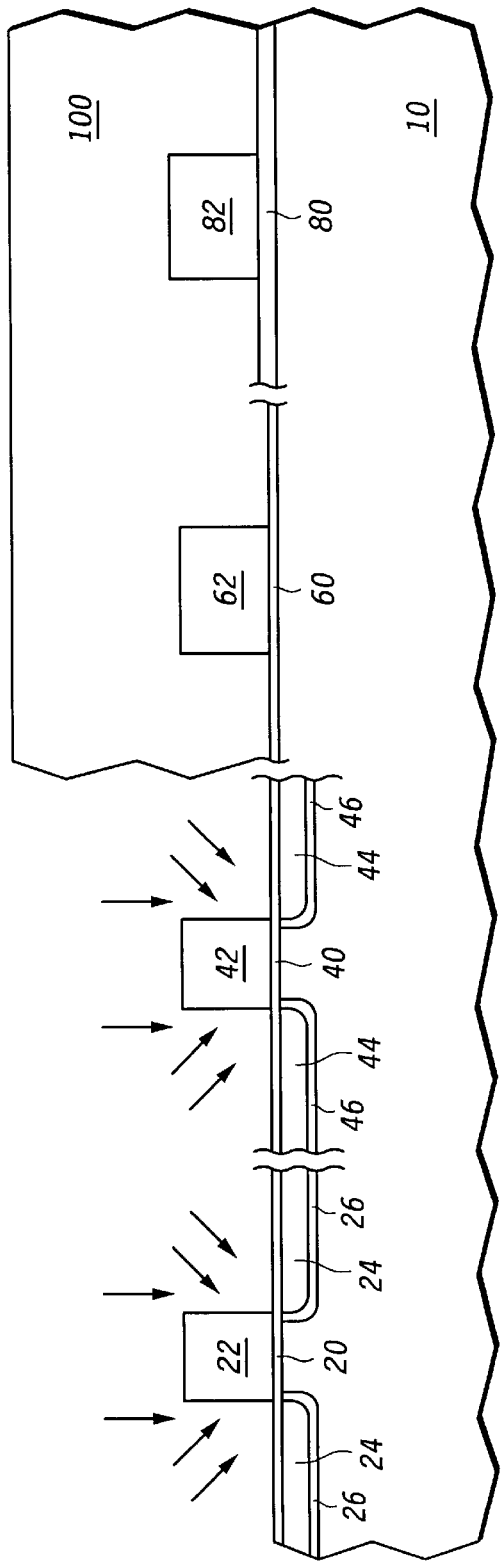
FIG. 2 is a cross-section of a portion of a semiconductor substrate illustrating forming portions of two core devices in accordance with the present invention.

Next, photoresist layer 100 is deposited over gate dielectrics 60 and 80 and gate electrodes 62 and 82, as shown in FIG. 2. As part of the formation of the core devices, a lightly doped drain or source and drain extension process is performed, which results in relatively shallow extensions 24 and 44. If well 10 is a p-type well, the process can be an implantation of arsenic with an energy of about 1–10 keV and a dose of approximately 5E14 to 2E15 atoms per centimeter cubed. However, if well 10 is an n-type well, $BF_2$ can be implanted at an energy of approximately 1–10 keV with a dose of approximately 1E14 to 1E15 atoms per centimeter cubed. Source and drain extensions 24 and 44 are formed adjacent to the gate electrodes, 22 and 42, respectively, to form transistors with channel under the gate electrodes. Source and drain extensions 24 and 44 are approximately the same depth.

A first halo implant is performed next to result in halos 26 and 46, as shown in FIG. 2. First halo implant is used to integrate the core devices with the I/O devices without additional well masks. Instead, gate electrodes 22 and 42 serve as the mask. The high threshold voltage needed for the low leakage core devices is achieved through channel doping increased by self-aligned tilt halo implants. The resulting chemical doping profile in the channel varies by at least a factor of three. The result is a leakage less than approximately 10 picoamps per microns of transistor width. The first halo process provides the benefits of the ability to engineer both the channel and drain while reducing mask count and process complexity.

For halo formation, the ion implantation is performed with a tilt angle between 7 and 45 degrees, but more preferably between 20 and 35 degrees. If well 10 is an n-type well, the halos can be formed using boron or indium. In the case that boron is implanted, the energy used is about 5 to 15 keV with a dose of approximately 5E12 to 5E13 atoms per centimeter cubed. However, if well 10 is a p-type well, arsenic, antimony, or phosphorous can be implanted to form the halo region. An energy of about 35–90 keV with a dose of approximately 5E12 to 5E13 atoms per centimeter cubed is used when implanting arsenic for the halos.

Next, photoresist layer 110, a mask, is formed over gate dielectric 20 and its corresponding source and drain extensions 24 and halo implants 26. However, if this device is not being formed on the substrate in combination with core device 510, it is not necessary to deposit a photoresist layer at this point.

Figure 3:
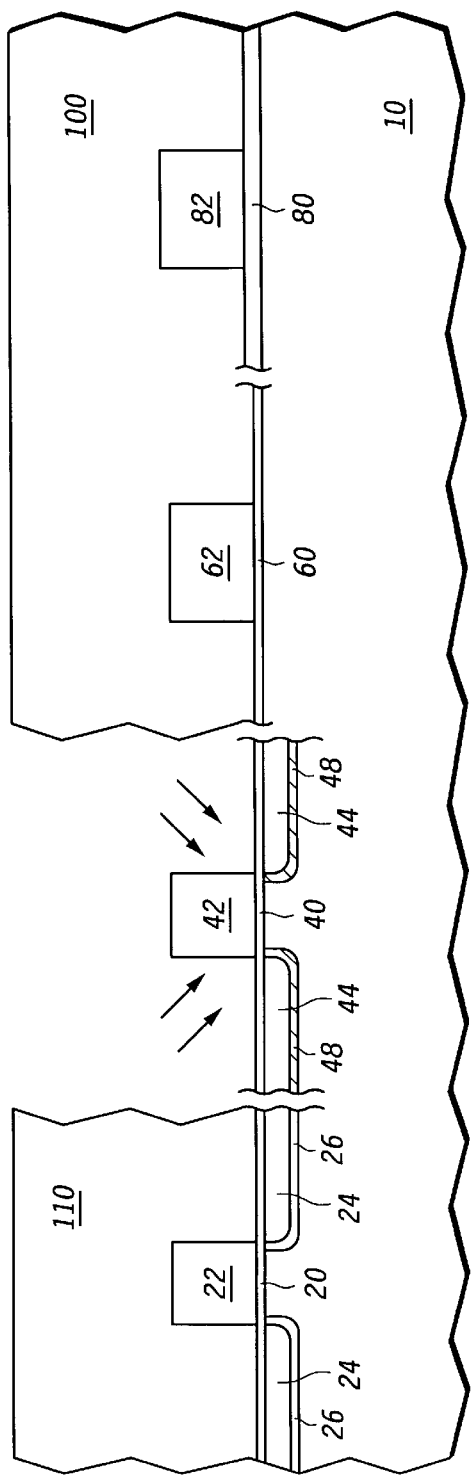
FIG. 3 is a cross-section of a portion of a semiconductor substrate showing super halo implant of a core device in accordance with the present invention.

Photoresist layer 110 and 100 are used in order to perform a second halo, or super halo, implant on source and drain extensions 44 and halo implants 46, resulting in second halos 48 in FIG. 3. Like the first halo implant, gate 42 is used as a mask. The super halo implant uses the same species energy ranges and dose ranges as were described in the first halo implant in regards to FIG. 2. It is not, however, necessary to use the same species, same energy or same dose as was used in the first halo implant. Preferably, a lower energy, higher tilt angle and a dose that is calculated in order to set the threshold voltage of the device will be used. In one embodiment, the second halo implant is a lower dose implant than the first halo implant. In other words, the second halo implant region has a lesser doping concentration than the first halo region.

Figure 4:
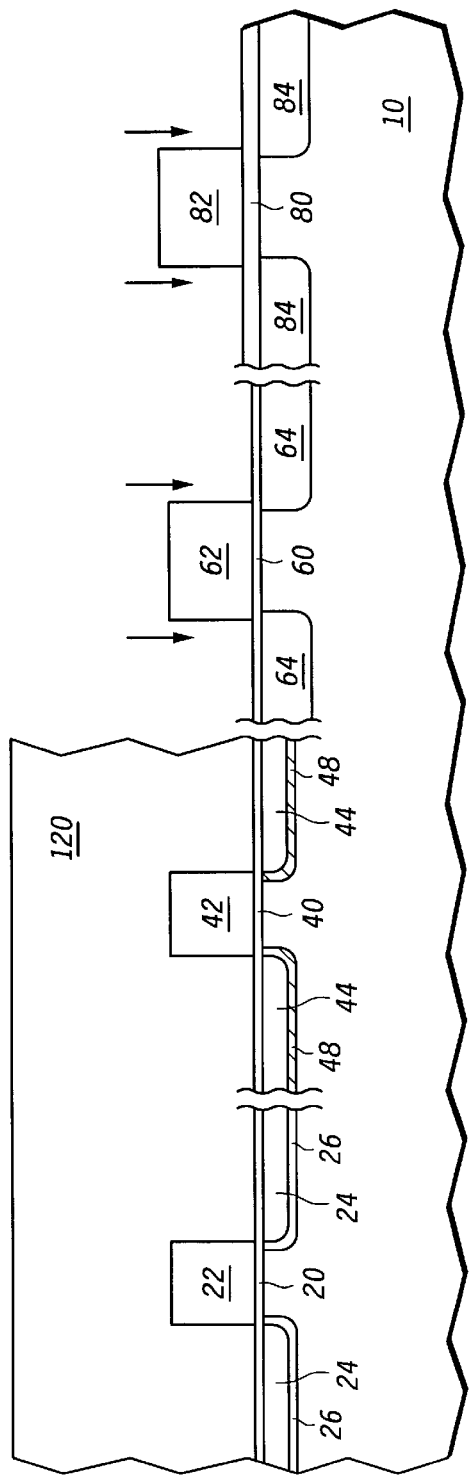
FIG. 4 is a cross-section of a portion of a semiconductor substrate illustrating forming a portion of an analog device and an I/O device in accordance with the present invention.

In FIG. 4, photoresist layer 120 is deposited over the core devices in order to form source and drain extensions 64 and 84 of the analog and I/O devices. Source and drain extensions 64 and 84 are formed adjacent to gate electrodes 62 and 82, respectively, to form transistors with channels under gate electrodes 62 and 82. Source and drain extensions 64 and 84 are approximately the same depth. In one embodiment, however, source and drain extensions 64 and 84 of analog device 520 and I/O device 530 are deeper than source and drains 24 and 44 of core devices 500 and 510. If well 10 is a p-type well, a phosphorous or combination of arsenic and phosphorous can be used. If phosphorous is implanted, an energy between about 10–20 keV and a dose of approximately 1E13 to 1E14 atoms per centimeter cubed is preferred. If well 10 is an n-type well, lightly doped drain (LDD) implantation is optional due to the fact that the hot carrier effect in an n-type wells is not as significant as it is in the p-type well. If an extension implant is desired, $BF_2$ can be used at an energy level of about 1–10 keV with a dose of about 1E13 to 2E14 atoms per centimeter cubed. Generally, the dose values used for the LDD implantation of the analog and I/O devices are less than that of the core devices.

After the source and drain extensions are formed, spacers 200 are manufactured by deposition, patterning and etching (not shown) of the spacer material. Typically, silicon nitride is used for spacers 200, however, other suitable materials can be used. Source and drains 30, 50, 70 and 90 are implanted next, as shown in FIG. 5. If well 10 is a p-type well, the source and drain implant can be phosphorous, arsenic or a combination of both. If arsenic is used, the implantation will be performed in an energy range of approximately 15–35 keV with a dopant concentration of approximately 3E15 to 6E15 atoms per centimeter cubed. If well 10 is an n-type well, $BF_2$ or B can be used for the implant. An energy range of about 3–7 keV with a dopant concentration of approximately 2E15–4E15 atoms per centimeter cubed is used when implanting boron. All devices can receive the same ion implantation process or a different one.

The resulting devices are all transistors with gate lengths. In one embodiment, the gate length of analog device 520 is greater than the gate length of core device 510. The gate length of I/O device 530 may also be greater than the gate length of analog device 510. The resulting devices also all have source and drain regions, which include source and drains (30, 50, 70, 90), source and drain extensions (24, 44, 64, 84) and, if applicable, halo implants (26 and 48).

The ability to have core devices, analog devices and I/O devices on the same chip is advantageous. For example, the presence of an analog device allows for a low $V_T$ device which corresponds to an improved signal to noise ratio, with an increased performance. This invention also provides for analog transistors with much improved output conductance behavior than the default core transistors used in the prior art as analog transistors. In addition, this processing scheme can have the benefit of eliminating masks. One of ordinary skill in the art acknowledges that the absence of a mask in an integrated circuit process decreases the cost of the process. The presence of a core device with a super halo implant has a benefit of better control over short channel effects and a tighter distribution of device characteristics. Another benefit is an improvement in gate dielectric integrity due to less diffusion of the dopant species from the super halo implants to the gate oxide after gate oxide growth and poly re-oxidation.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than restrictive sense, and all such modifications are intended to be included within the scope of the present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any of the claims.

What is claimed is:

1. A method of making an integrated circuit, comprising:
   forming a semiconductor well;
   forming a first gate dielectric and second gate dielectric on the semiconductor well, wherein the first gate dielectric is thinner than the second gate dielectric;
   forming a first gate over the first gate dielectric;
   forming a second gate over the second gate dielectric;
   forming a first source region and a first drain region in the semiconductor well substantially adjacent to the first gate to form a first transistor with a channel under the first gate, wherein the first source region and first drain region comprise first source and drain extensions;

forming a second source region and a second drain region in the semiconductor well substantially adjacent to the second gate to form a second transistor with a channel under the second gate, wherein:
the second source region and second drain region comprise second source and drain extensions; and
the second source and drain extensions are deeper than the first source and drain extensions; and performing a first halo implant using the first gate as a mask.

2. The method of claim 1, wherein the semiconductor well is doped to set the threshold for the second transistor s that current leakage is less than approximately 10 picoamps per micron of transistor width.

3. The method of claim 1, wherein the halo implant results in a chemical doping profile in the channel which varies by at least a factor of three.

4. The method of claim 1, wherein the halo implant results in the first transistor having a leakage which is less than approximately 10 picoamps per micron of transistor width.

5. The method of claim 1, further comprising:
forming a third gate dielectric simultaneously with forming the first gate dielectric;
forming a third gate over the third gate dielectric; and
forming a third source region and a third drain region in the semiconductor well substantially adjacent to the third gate to form a third transistor with a channel under the third gate, wherein:
the third source region and third drain region comprise third source and drain extensions; and
the third source and drain extensions are approximately the same depth as the second source and drain extensions.

6. The method of claim 1, further comprising:
forming a third gate dielectric simultaneously with forming the first gate dielectric;
forming a third gate over the third gate dielectric;
forming a third source region and a third drain region in the semiconductor well substantially adjacent to the third gate to form a third transistor with a channel under the third gate, wherein:
the third source region and third drain region comprise third source and drain extensions; and
the third source and drain extensions are approximately the same depth as the first source and drain extensions; and
performing a second halo implant using the third gate as a mask, wherein the second halo implant is a lower dose than the first halo implant.

7. A method of making an integrated circuit, comprising:
forming a semiconductor well;
forming a first gate dielectric, second gate dielectric and third dielectric on the semiconductor well, wherein the first gate dielectric is thinner than the second dielectric, and the fi St dielectric is approximately the same thickness as the third dielectric;
forming a first gate over the first gate dielectric;
forming a second gate over the second gate dielectric;
forming a third gate over the third gate dielectric;
forming a first source region and a first drain region in the semiconductor well substantially adjacent to the first gate to form a first transistor with a channel under the first gate, wherein the first source region and first drain region comprise first source and drain extensions;

forming a second source region and a second drain region in the semiconductor well substantially adjacent to the second gate to form a second transistor with a channel under the second gate, wherein:
the second source region and second drain region comprise second source and drain extensions; and
the second source and drain extensions are deeper than the first source and drain extensions; and forming a third source region and a third drain region in the semiconductor well substantially adjacent to the third gate to form a third transistor with a channel under the third gate, wherein:
the third sour e region and third drain region comprise third source and drain extensions; and
the third source and drain extensions are approximately the same depth as the second source and drain extensions.

8. The method of claim 7, wherein:
the first transistor has a first gate length;
the second transistor has a second gate length;
the third transistor has a third gate length; and
wherein the third gate length is greater than the first gate length.

9. The method of claim 8, wherein the second gate length is greater than the first gate length.

10. The method of claim 7, further comprising:
performing a first halo implant in the channel under the first gate using the first gate as a mask, resulting in a chemical doping profile which varies by at least a factor of three.

11. The method of claim 7, further comprising:
forming a fourth gate dielectric simultaneously with forming the first dielectric;
forming a fourth gate over the fourth gate dielectric;
forming a fourth source region and a fourth drain region in the semiconductor well substantially adjacent to the fourth gate to form a fourth transistor with a channel under the fourth gate, wherein:
the fourth source region and fourth drain region comprise fourth source and drain extensions; and
the fourth source and drain extensions are approximately the same depth as the first source and drain extensions; and
performing a second halo implant using the fourth gate as a mask, wherein the second halo implant is a lower dose than the first halo implant.

12. A method of making an integrated circuit, comprising:
forming a semiconductor well;
forming a first gate dielectric and second gate dielectric on the semiconductor well;
forming a first gate over the first gate dielectric;
forming a second gate over the second gate dielectric;
forming a first source region and a first drain region in the semiconductor well substantially adjacent to the first gate to form a first transistor with a channel under the first gate, wherein the first source region and first drain region comprise first source and drain extensions;
forming a second source region and a second drain region in the semiconductor well substantially adjacent to the second gate to form a second transistor with a channel under the second gate, wherein:

the second source region and second drain region comprise second source and rain extensions; and the second source and drain extensions are deeper than the first source and drain extensions; and performing a first halo implant using the first gate as a mask.

13. The method of claim 12, wherein the semiconductor well is doped to set the threshold for the second transistor so that current leakage is less than approximately 10 picoamps per micron of transistor width.

14. The method of claim 12, wherein the first halo implant results in a chemical doping profile in the channel which varies by at least a factor of three.

15. The method of claim 12, wherein the first halo implant results in the first transistor having a leakage which is less than approximately 10 picoamps per micron of transistor width.

16. The method of claim 12, wherein the first gate dielectric and the second dielectric are formed simultaneously.

17. The method of claim 16, further comprising:

forming a third gate dielectric, wherein the third gate dielectric is thicker than the first gate dielectric;

forming a third gate over the third gate dielectric; and forming a third source region and a third drain region in the semiconductor well substantially adjacent to the third gate to form a third transistor with a channel under the third gate, wherein:

the third source region and third drain region comprise third source and drain extensions; and the third source and drain extensions are approximately the same depth as the second source and drain extensions.

18. The method of claim 17, further comprising:

forming a fourth gate dielectric simultaneously with forming the first gate dielectric;

forming a fourth gate over the fourth gate dielectric;

forming a fourth source region and a fourth drain region in the semiconductor well substantially adjacent to the fourth gate to form a fourth transistor with a channel under the fourth gate, wherein:

the fourth source region and a fourth drain region comprise fourth source and drain extensions; and the fourth source and drain extensions are approximately the same depth as the first source and drain extensions; and performing a second halo implant using the fourth gate as a mask, wherein the second halo implant is a lower dose than the first halo implant.

\* \* \* \* \*

UNITED STATES PATENT AND TRADEMARK OFFICE
CERTIFICATE OF CORRECTION

PATENT NO. : 6,617,214 B2
DATED : September 9, 2003
INVENTOR(S) : Yeap et al.

It is certified that error appears in the above-identified patent and that said Letters Patent is hereby corrected as shown below:

<u>Column 5,</u>
Line 60, change "fi St" to -- first --

<u>Column 6,</u>
Line 17, change "sour e" to -- source --

Signed and Sealed this

Sixteenth Day of December, 2003

JAMES E. ROGAN
*Director of the United States Patent and Trademark Office*